US009400337B2

(12) United States Patent
Jones et al.

(10) Patent No.: US 9,400,337 B2
(45) Date of Patent: Jul. 26, 2016

(54) BEAM ACCELEROMETER

(71) Applicant: L-3 Communications Corporation, New York, NY (US)

(72) Inventors: Sterling William Jones, Baltimore, MD (US); David Ralph Kimball, Annapolis, MD (US)

(73) Assignee: L-3 COMMUNICATIONS CORPORATION, New York, NY (US)

( * ) Notice: Subject to any disclaimer, the term of this patent is extended or adjusted under 35 U.S.C. 154(b) by 498 days.

(21) Appl. No.: 13/834,467

(22) Filed: Mar. 15, 2013

(65) Prior Publication Data
US 2014/0269203 A1 Sep. 18, 2014

(51) Int. Cl.
H01L 41/113 (2006.01)
G01V 1/18 (2006.01)
G01P 15/09 (2006.01)

(52) U.S. Cl.
CPC . *G01V 1/18* (2013.01); *G01P 15/09* (2013.01); *G01V 1/181* (2013.01); *H01L 41/1132* (2013.01)

(58) Field of Classification Search
CPC .................................................. H01L 41/1132
USPC ........................................................ 310/338
See application file for complete search history.

(56) References Cited

U.S. PATENT DOCUMENTS 3,002,391 A  10/1961 Holmes
5,914,556 A *  6/1999 Tabota ............... H01L 41/1132
                                                    310/328
6,883,638 B1   4/2005 Maxwell et al.
8,027,225 B2   9/2011 Kamata et al.
8,125,852 B2   2/2012 Kamata
8,208,347 B2   6/2012 Woo
8,274,862 B2   9/2012 Sallas
8,305,845 B2  11/2012 Kamata
2007/0164189 A1*  7/2007 Corsaro et al. ............ 248/614
2008/0072677 A1   3/2008 Rhee et al.
(Continued)

FOREIGN PATENT DOCUMENTS

WO   WO 2011/035123 A1   3/2011
WO   WO 2012/030940 A2   3/2012
(Continued)

OTHER PUBLICATIONS

Fox, David R., "A Low-Density Extended Acoustic Sensor for Low-Frequency Arrays", IEEE Journal of Oceanic Engineering, vol. 13, No. 4, Oct. 1998, pp. 291-295.

*Primary Examiner* — Derek Rosenau
(74) *Attorney, Agent, or Firm* — Condo Roccia Koptiw LLP

(57) ABSTRACT

Methods and devices are disclosed for measuring low levels of acceleration caused by low frequency seismic waves. For example, an omnidirectional beam accelerometer configured to measure low frequency waves is disclosed. The omnidirectional beam accelerometer may include three beam acceleration sensors. Each beam acceleration sensor may include a respective mass and a respective beam. Each respective beam may be comprised at least in part of a piezoelectric material. Each beam acceleration sensor may have a ratio of mass density [kg/m$^3$] to beam stiffness [N/m] of at least $4.5 \times 10^{-5}$ kg/Nm$^2$. The omnidirectional beam accelerometer may also include a housing to ensure the sensors are operating in orthogonal directions and an interface circuit to interface between the sensor and external circuitry.

18 Claims, 10 Drawing Sheets

(56) References Cited

U.S. PATENT DOCUMENTS

| | | | |
|---|---|---|---|
| 2008/0079331 A1* | 4/2008 | Butler et al. | 310/331 |
| 2009/0146533 A1* | 6/2009 | Leskinen et al. | 310/338 |
| 2009/0279387 A1 | 11/2009 | Tenghamn et al. | |
| 2010/0031746 A1* | 2/2010 | Paros et al. | 73/382 G |
| 2011/0153219 A1 | 6/2011 | Fernihough | |
| 2012/0227274 A1 | 9/2012 | Watanabe et al. | |
| 2012/0326566 A1 | 12/2012 | Koyama et al. | |

FOREIGN PATENT DOCUMENTS

| WO | WO 2012/039681 A1 | 3/2012 |
|---|---|---|
| WO | WO 2014/096109 A3 | 6/2014 |

\* cited by examiner

BEAM ACCELEROMETER

BACKGROUND

In order to study geologic formations and materials located below the surface of the Earth, geophysical techniques are often utilized in order to indirectly determine or identify sub-surface formations. For example, seismic measurements taken on the surface of the Earth may be utilized to measure the physical properties of the subsurface Earth based on measurements of the propagation of low-frequency pressure waves that pass through and/or are reflected by different types of subsurface structures. Reflection seismology, seismic refraction, and seismic tomography are examples of such seismic identification techniques. The seismic measurements may be used to determine properties of the subsurface materials, along with the anomalies in these properties, in order to detect or infer the presence and position of ore minerals, hydrocarbons, geothermal reservoirs, groundwater reservoirs, and other geological structures.

Seismic reflection techniques are the most widely used geophysical technique for hydrocarbon exploration. For example, such techniques may be used to map the subsurface distribution of stratigraphy and its structure, which may then be used to determine the location of potential hydrocarbon accumulations. One reason seismic reflection techniques are so popular is because they provide a method for interpolating and extrapolating subsurface information over a large area.

Typically, to measure a seismic wave that has propagated through and/or was reflected by subsurface geologic structures, measurements are performed at the surface of the Earth to detect small, low-frequency ground displacement. The measurements that are performed at different times and/or locations may then be used to indirectly identify subsurface regions that have a higher probability of containing a desired material (e.g., ores, hydrocarbons, geothermal reservoirs, groundwater reservoirs, gas formations, etc.). For example, geophones are an example of a device that converts ground movement into a voltage in order to determine the amount of displacement.

Geophones may be passive analog devices that include a spring-mounted magnetic mass moving within a wire coil to generate an electrical signal. However, geophones often have difficulty operating at relatively low frequencies (e.g., 1-3 Hz and lower) due to their decreased sensitivity at these frequencies. This limitation in the range of the device may make distinguishing between signals of interest and ambient noise difficult. For example, since the frequency response of a geophone is typically that of a harmonic oscillator, and the corner frequency may be proportional to the inverse root of the moving mass within the geophone. Thus, geophones with low operating ranges on the order of 1-3 Hz are often impractical for deployment at the scale utilized for seismic imaging of large regions (e.g., they may be very large and cannot be practically used in large numbers over a large geographic region). Although the corner frequency may be lowered electronically, such techniques may introduce additional noise, may add additional processing complexity, may require higher power, and/or may increase the cost of the systems to impractical levels.

More recently, microelectromechanical systems (MEMS) have been utilized to operate at relative lower frequencies (e.g., perhaps as low as 3 Hz) for seismic exploration. MEMS devices may be accelerometers or geophones that utilize semi-conductive materials to perform acceleration or displacement measurements. However, due to the small size of MEMS devices and other factors, in order to detect the ground motion using MEMS devices an active feedback circuit may have to be utilized in order to measure the position of one or more small pieces of semi-conductive material within the device. As such, utilizing MEMS technology may require higher power operation while still lacking the capability to operate at desirable low-frequency ranges (e.g., 1-3 Hz and lower) in a commercially practical deployment.

Since these low frequency seismic waves may provide more information about subsurface formations that are found deeper within the Earth as compared to relatively higher frequency seismic waves, devices that are capable of detecting lower frequency information without the introduction of additional noise while still operating at relatively low power levels may be more desirable for many applications.

SUMMARY

Methods and devices are disclosed for measuring low levels of acceleration caused by low frequency seismic waves. For example, an omnidirectional beam accelerometer configured to measure low frequency waves is disclosed. The omnidirectional beam accelerometer may include three beam acceleration sensors. Each beam acceleration sensor may include a respective mass and a respective beam. Each respective beam may be comprised at least in part of a piezoelectric material. Each beam acceleration sensor may have a ratio of mass density [$kg/m^3$] to beam stiffness [$N/m$] of at least $4.5 \times 10^{-5}$ $kg/Nm^2$.

The omnidirectional beam accelerometer also may include a housing. For example, each of the three beam acceleration sensors may be operably coupled to the housing knife clamps. The knife clamps may be applied to each respective end of the beams of the beam acceleration sensors. Each of the three beam acceleration sensors may be configured to measure acceleration in a respective orthogonal directions. The sensors may be designed or configured to achieve a cross axis isolation of approximately 40 dB or better. Such cross axis isolation may facilitate the derivation of an acceleration vector that is not overly biased due to torsion that is applied to one or more of the orthogonal sensors.

The omnidirectional beam accelerometer also may include an interface circuit operably coupled to each of the three beam acceleration sensors. The interface circuit may be configured to interface the three beam acceleration sensors with an analog to digital (A/D) converter. For example, the interface circuit may have a relatively high input impedance (e.g., leading to a high shunt resistance for Johnson noise), while having a relatively low output impedance. For example, the interface circuit may have an input impedance of at least 500 MΩ and an output impedance on the order of 20 kΩ.

The respective beams of each of the beam acceleration sensors may further include a center vein, for example so that the knife clamps can be applied to the beam without disturbing the operation of the piezoelectric ceramic. The center vein may separate the piezoelectric material into two plates, and the input to the interface circuit may be applied to each of the plates. In an example, each of the respective masses may be comprised of a relatively dense material such as Tungsten or a tungsten alloy. The density of the mass may affect the desired stiffness of the beam.

The acceleration sensors may be passive sensing elements such that the omnidirectional beam accelerometer may operate at relatively low power. For example, the omnidirectional acceleration sensor may include a power unit, and the power unit may operate at 25 mW or less per sensing axis. The acceleration sensors may be arranged within the omnidirectional beam accelerometer in a variety of ways. For example, each center of mass for each respective mass may be located along a common line within the omnidirectional beam accelerometer. In an example, in order to achieve a relatively low noise floor at the frequency range of interest (e.g., 1-3 Hz and lower), the corner frequency for omnidirectional beam accelerometer may be set to less than 1 Hz. For example, such a corner frequency may be achieved by having a capacitance of the beam comprised of the piezoelectric material be at least 1 nanofarad, and a shunt resistance of the omnidirectional beam accelerometer that may be at least 1 GΩ.

Acceleration sensors for measuring low frequency seismic waves are also disclosed. For example, the acceleration sensor may include a beam comprising a piezoelectric ceramic. The ratio of the piezoelectric voltage constant [Vm/N] to the elastic modulus [N/m$^2$] of the piezoelectric ceramic may be at least $1.1 \times 10^{-13}$ Vm$^3$/N$^2$. The acceleration sensor may also include a mass operably coupled to the center of the beam. A ratio of the density of the mass to the stiffness of the beam may be at least $4.5 \times 10^{-5}$ kg/Nm$^2$.

The beam may further include a center vein that separates the piezoelectric ceramic into two halves. For example, the piezoelectric ceramic may be comprised of Lead Zirconate Titanate (PZT) and the center vein may be comprised of brass. The piezoelectric ceramic may be shaped as a rectangular prism, and each half of the piezoelectric ceramic may have a length-to-width ratio of at least two to one but not more than four to one. Such dimensions may allow for a stiffness that falls within the desired operating range while still achieving a desired level of cross axis isolation. The stiffness of the piezoelectric ceramic may be at least two orders of magnitude larger than the stiffness of the center vein. In an example, the piezoelectric ceramic may have a capacitance of at least 1 nanofarad. Such a relatively high capacitance may facilitate low-frequency operation by lowering the noise floor.

Methods for measuring low frequency seismic waves are also disclosed. For example, a method may include measuring a voltage across a piezoelectric material. The piezoelectric material may span a beam, a mass may be located at the center of the beam, and the beam may be operably clamped at respective ends of the beam. The method may further include determining a relative displacement of the mass based on the voltage, for example wherein a ratio of the density of the mass to the stiffness of the piezoelectric ceramic is at least $4.5 \times 10^{-5}$ kg/Nm$^2$, for example to allow for relative high sensitivity operation at relatively low operating frequencies. The method may further include determining an acceleration experienced by the mass based on the displacement of the mass. In an example, the acceleration experienced by the mass may be due to a seismic wave. The voltage across the piezoelectric ceramic may be sensitive to seismic waves in at least a frequency range of 1-3 Hz. For example, the piezoelectric ceramic may have a sensitivity of at least 1 V/g in the frequency range of 1-3 Hz.

BRIEF DESCRIPTION OF THE DRAWINGS

The following detailed description may be best understood when taken in conjunction with the accompanying drawings, of which.

DETAILED DESCRIPTION

Disclosed herein are methods and devices for passively measuring low-frequency seismic waves. For example, a beam accelerometer may be operably configured to measure seismic waves at a frequency range between 1-3 Hz or lower while utilizing relatively low amounts of power. Such functionality may make the device commercially viable for large scale undersea deployment (e.g., where large numbers of devices may be distributed across the seabed for relatively long amounts of time, perhaps under power-limited scenarios). However, it is noted that although examples used herein may be described with reference to beam accelerometer operation with respect to the measurement of seismic waves, the methods and devices disclosed herein may be equally applicable to measure other types of acceleration or displacement. Additionally, although examples may be used to describe the devices with reference to measuring seismic waves for the purpose of subsurface hydrocarbon identification, the methods and devices disclosed herein may be utilized for other purposes such as mapping subsurface structures within a region, to elucidate the underlying structures and spatial distribution of rock units, to detect structures such as faults, folds and intrusive rocks, and/or the like. Other potential application may include monitoring environmental impacts, imaging subsurface archaeological sites, ground water investigations, subsurface salinity mapping, civil engineering site investigations, interplanetary imaging, and/or the like.

Figure 1:
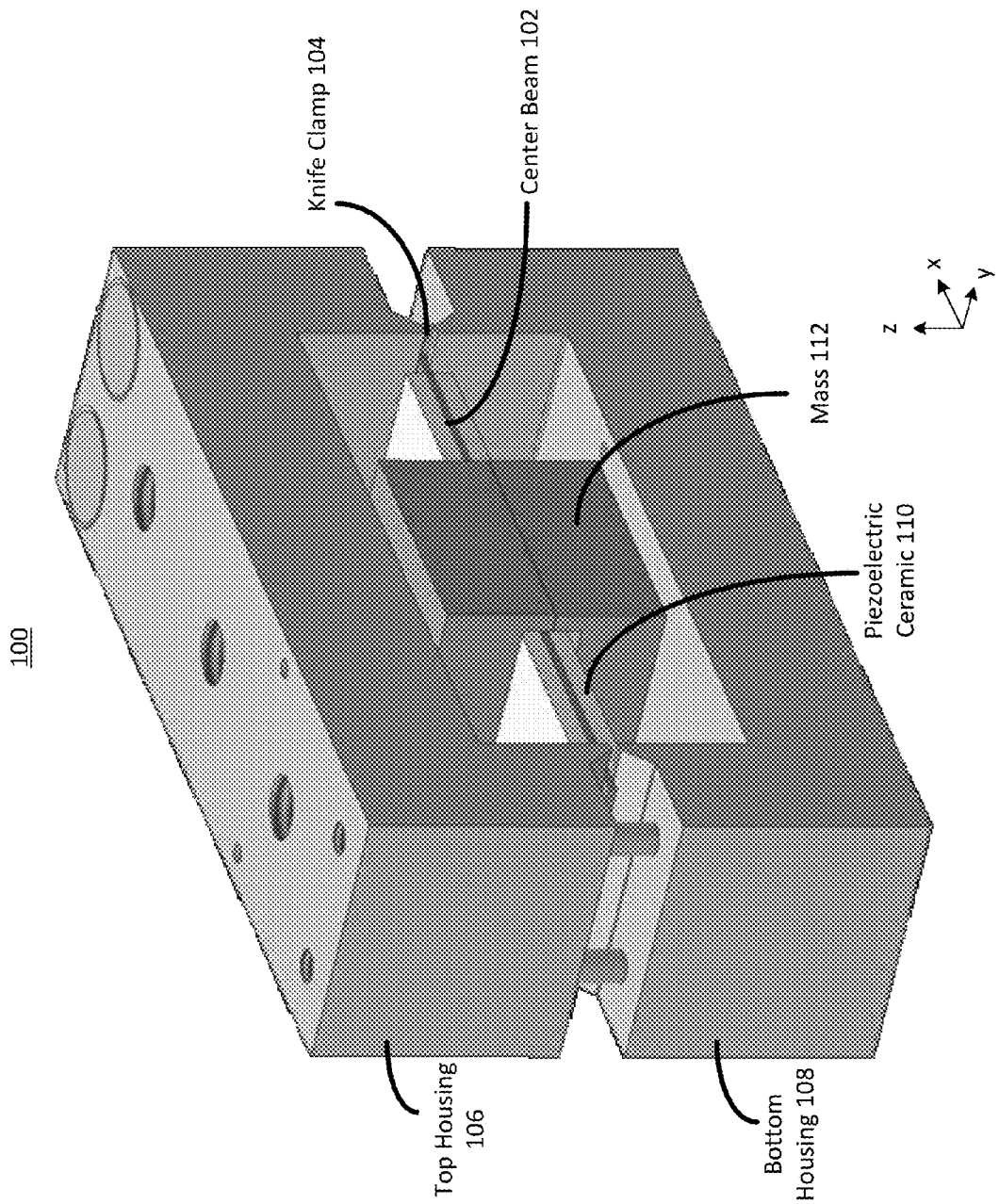
FIG. 1 illustrates an example beam accelerometer that is configured to measure acceleration in one direction.

FIG. 1 illustrates an example Beam Accelerometer 100. Beam Accelerometer 100 may be configured to measure acceleration in given direction. For example, Beam Accelerometer 100 may be configured to measure acceleration caused by pressure waves that are perpendicular to the plane formed by Center Beam 102 (e.g., in the direction of the z-axis in FIG. 1). Top Housing 106 and Bottom Housing 108 may be constructed in order to maintain Center Beam 102 in a specified position or orientation, for example using Knife Clamp 104. Knife Clamp 104 may extend the entire width of Center Beam 102 in order to prevent torsion of Center Beam 102. Although for purposes of clarity a single Knife Clamp 104 is labeled in FIG. 1, Knife Clamp 104 may be applied to each end of Center Beam 102. Piezoelectric Ceramic 110 may be applied to both sides of Center Beam 102. Piezoelectric Ceramic 110 may be a material that experiences specific voltage responses in the presence of compression or stress. For example, Piezoelectric Ceramic 110 may convert mechanical energy from the bending of Piezoelectric Ceramic 110 to electrical potential in the form of a voltage.

The operation of Piezoelectric Ceramic 110 during acceleration measurements is discussed in more detail below. Mass 112 may be attached to Piezoelectric Ceramic 110 and/or Center Beam 102. Mass 112 may be suspended above Bottom Housing 108 and below Top Housing 106. Center Beam 102 and/or Piezoelectric Ceramic 110 may be referred to as the beam of the beam accelerometer.

During operation, pressure waves, for example seismic pressure waves, may impact one or more of Top Housing 106 and/or Bottom Housing 108 (the "Housing"). The pressure wave may impart a force on the Housing, causing an acceleration. The Housing may then transfer the pressure to Center Beam 102 via Knife Clamp 104. As Mass 112 may be a relatively high density mass that was at rest (e.g., and/or was experiencing a different level of acceleration) prior to the impact of the pressure wave, inertia may dictate that the force from the pressure wave displaces Mass 112 less than that of Center Beam 102 and/or Piezoelectric Ceramic 110. Therefore, Center Beam 102 and/or Piezoelectric Ceramic 110 may bend or bow upon the impact of the pressure wave due to the presence of Mass 112.

The bending of Piezoelectric Ceramic 110 may cause a change in voltage across the two faces of Piezoelectric Ceramic 110. The change in voltage may be measured in order to determine the level of acceleration imparted by the pressure wave. In order to detect acceleration caused by pressure waves at relatively low frequencies (e.g., 1-3 Hz and lower), the materials utilized to construct Beam Accelerometer 100 and/or the dimensions of one or more components of Beam Accelerometer 100 may be selected to facilitate low frequency operation.

Figure 2A:
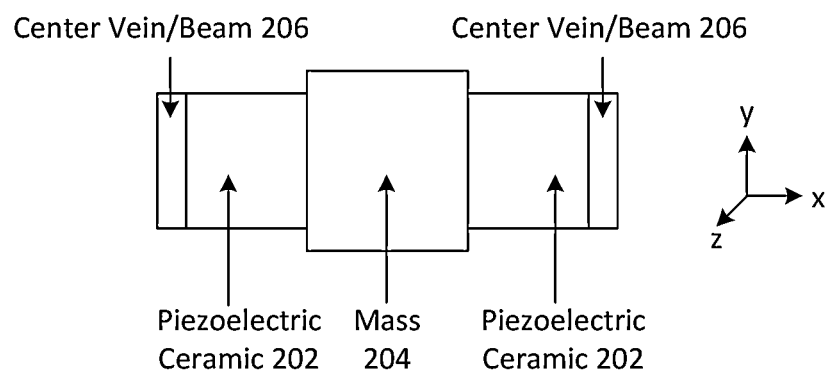
FIGS. 2A and 2B illustrate an example sensor that may be included in a beam accelerometer.

FIG. 2A illustrates a top view of example Acceleration sensor 200 that may be included in an accelerometer. Acceleration sensor 200 may be a passive sensor that is configured to measure the relative amount of displacement or acceleration experienced by Mass 204 relative to plane formed by Piezoelectric Ceramic 202. Although Acceleration sensor 200 is shown to include a piezoelectric ceramic in FIG. 2A, other types of piezoelectric materials may be used (e.g., crystals such as quartz). For example, Acceleration sensor 200 may be configured to measure the amount of acceleration experienced by Mass 204 across the z-axis (e.g., perpendicular to the x-y plane) shown in FIG. 2A. Acceleration sensor 200 may also include Center Vein/Beam 206, which may be used to apply a clamp in order to hold Acceleration sensor 200 in a specified location. The clamping mechanism may be applied to Center Vein/Beam 206 rather than to Piezoelectric Ceramic 202 in order to avoiding disturbing the voltage measurement across the faces of Piezoelectric Ceramic 202 (e.g., applying the clamp directly to Piezoelectric Ceramic 202 may cause a short-circuit).

When a seismic wave interacts with Acceleration Sensor 200, Mass 204 may apply a force to Piezoelectric Ceramic 202 since Piezoelectric Ceramic 202 is attached to Center Vein/Beam 206, which is clamped in place at each end. The force applied by Mass 204 to Piezoelectric Ceramic 202 may cause Piezoelectric Ceramic 202 to bend. Due to the properties of piezoelectric materials, the stress may cause a change in voltage to be induced across the piezoelectric material. This change in voltage may be related to and/or proportional to the amount of force exerted between Mass 204 and Piezoelectric Ceramic 202. Therefore, the change in voltage across Piezoelectric Ceramic 202 may be used to determine properties of the seismic wave that caused the acceleration in the mass.

Piezoelectric Ceramic 202 may be relatively high capacitance piezoelectric material. For example, while the microelectronic Silicon materials and/or piezoelectric materials used in traditional MEMS accelerometers may be on the order of picofarads or less (e.g., 1 pF=$10^{-12}$ F), the capacitance of the Piezoelectric Ceramic 202 may be on the order of nanofarads (e.g., 1 nF=$10^{-9}$ F). In an example, the capacitance of Piezoelectric Ceramic 202 may be at or around 2.2 nF. Utilizing a relatively high capacitance piezoelectric material may facilitate lower frequency operation by lowering the noise level experienced at the low frequencies.

For example, the noise level experienced at low frequency accelerometer operation may be heavily dependent on the sensing element capacitance and the sensing element shunt resistance. In effect, the sensing element capacitance and the shunt resistance may act as a low-pass filter for Johnson noise. To lower the effective operational frequency (e.g., lower the frequency at which the sensing element acts as a low-pass filter for noise), the sensor may utilize a piezoelectric material that has a relatively high sensing element capacitance and a relatively high shunt resistance within the measurement electronics (e.g., interface circuit). By utilizing a piezoelectric with a capacitance on the range of nanofarads (e.g., rather than on the order of picofarads as is typical in many MEMS accelerometer applications), the accelerometer may achieve an equivalent noise density (e.g., for an operational frequency range of approximately 1-187.5 Hz) of approximately −155 $dBg^2$/Hz. For the frequency range from approximately 1 Hz to approximately ¾ of the Nyquist frequency, such noise densities may result in an Equivalent Input Noise (EIN) of 243 $ng_{rms}$ for 2 ms and/or 171 $ng_{rms}$ for 4 ms. As an example comparison, typical MEMS devices may have an equivalent noise density in the range of approximately −147 or −148 $dBg^2$/Hz, meaning that a beam accelerometer as described herein may achieve a noise level (e.g., noise floor) that is approximately 2.4 times lower than that of the MEMS device. Additionally, the MEMS predicted noise floor is often estimated using a lower range endpoint of between 3-10 Hz, and since the noise may be dominated by the low frequency signals, the noise floor for MEMS devices may be even higher than −147 or −148 $dBg^2$/Hz if the range of frequencies considered is extended below 3 Hz.

The piezoelectric ceramic may be a material such as Lead Zirconate Titanate (PZT), although other piezoelectric materials may be utilized. For example, the piezoelectric ceramic may be composed of PZT, Barium Titanate, Lead Titanate, Lead Magnesium, Titanate, and/or the like. Additionally, the piezoelectric material may be selected based on one or more of its properties, such its Young's Modulus, its piezoelectric voltage constant, and/or the like. For example, if PZT is used, one or more of PZT-4, PZT-5A, PZT-5H, PZT-8, and/or the like may be used. Table 1, below, lists example materials that may be used for the piezoelectric ceramic in a beam accelerometer.

TABLE 1

|  |  | PZT-4 | PZT-5A | PZT-5H | PZT-8 |
|---|---|---|---|---|---|
| Coupling Coefficients | $k_{33}$ | 0.700 | 0.710 | 0.750 | 0.640 |
|  | $k_{31}$ | 0.330 | 0.340 | 0.390 | 0.300 |

TABLE 1-continued

|  |  | PZT-4 | PZT-5A | PZT-5H | PZT-8 |
|---|---|---|---|---|---|
| Piezoelectric Constants | $k_{15}$ | 0.710 | 0.690 | 0.680 | 0.550 |
|  | $k_p$ | 0.580 | 0.600 | 0.650 | 0.510 |
|  | $d_{33}$ ($\times 10^{-12}$ m/V) | 295 | 374 | 585 | 225 |
|  | $d_{31}$ | −122 | −171 | −265 | −97 |
|  | $d_{15}$ | 500 | 585 | 730 | 330 |
|  | $g_{33}$ ($\times 10^{-3}$ Vm/N) | 24.9 | 24.8 | 19.7 | 24.0 |
|  | $g_{31}$ | −10.6 | −11.5 | −8.5 | −10.9 |
|  | $g_{15}$ | 39.0 | 38.2 | 29.0 | −28.9 |
| Free Dielectric Constants | $K^T_{33}$ | 1300 | 1700 | 3400 | 1000 |
|  | $K^T_{11}$ | 1475 | 1730 | 3130 | 1290 |
| Elastic Constants | $S^E_{33}$ ($\times 10^{-12}$ m$^2$/N) | 15.5 | 18.8 | 20.0 | 13.5 |
|  | $S^E_{11}$ | 12.3 | 15.0 | 15.6 | 10.0 |
| Physical Properties | Density (kg/m$^3$) | 7600 | 7500 | 7500 | 7500 |
|  | $\epsilon$ ($\times 10^{10}$ N/m$^2$) | 7.8 | 6.6 | 6.4 | 9.9 |
|  | Curie Point (° C.) | 325 | 350 | 195 | 300 |

Figure 2B:
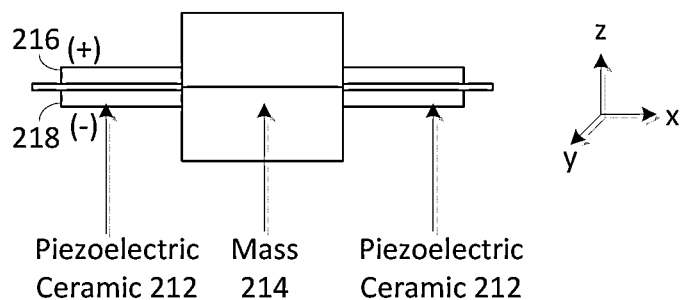

When the mass is displaced relative to the housing, the piezoelectric material may shear or bend, resulting in a change in voltage across two of its faces. For example, as illustrated in FIG. 2B (e.g., a side view of an acceleration sensor), when Mass 214 is displaced along the z-axis, Piezoelectric Ceramic 212 may bow or bend. The bending of Piezoelectric Ceramic 212 may change the voltage level between Anode Side 216 and Cathode Side 218.

In order to utilize the sensing elements to detect low-frequency seismic waves in practical deployments, the mass may be comprised of a relatively high density material. For example, since the amount of displacement of the mass may be directly proportional to the amount of acceleration the sensing element is exposed to, using a larger mass may cause a greater amount of bending or shearing of the piezoelectric ceramic. However, the overall size of the mass may be limited in order to achieve a desired level of cross-axis isolation and/or ensure that the sensor may be constructed in a practical manner. For example, although an extremely large mass may allow for a larger piezoelectric voltage response when the mass is accelerated, such a mass may impart a torsion force on the piezoelectric material (e.g., changing the response function and leading to incorrect measurements) and/or may be impractically large such that it may not be able to be operably connected to the piezoelectric ceramic within the housing. Similarly, altering the size and/or dimensions of piezoelectric ceramic may alter the sensitivity of the device such that it can detect smaller amplitude forces; however, such a size may be too large to be used in practical manner for large scale deployment (e.g., thousands of sensors on a sea floor). For this reason, in an example the overall size of an omnidirectional beam accelerometer (e.g., including three sensing elements) may be designed to be less than 8 in$^3$.

In order to allow for low-frequency operation, the mass may be selected to be a high density material such as Tungsten or a Tungsten-alloy. Example Tungsten alloys that may be utilized may include, for example, alloys that are in accordance with the American Society for Testing and Materials (ASTM) "Standard Specification for Tungsten Base, High-Density Metal" (ASTM B777), which is incorporated by reference herein. For example Class 1, 2, 3, and/or 4 Tungsten alloys from ASTM B777 may be utilized. Such alloys may have densities near or around 17 g/cm$^3$ or 1.7×10$^4$ kg/m$^3$. Other materials that may be utilized for the mass may include dense metals or metal alloys comprised of one or more of Tungsten, Gold, Palladium, Molybdenum, Tantalum, Rhenium, Niobium, and/or the like in any combination.

Figure 3A:
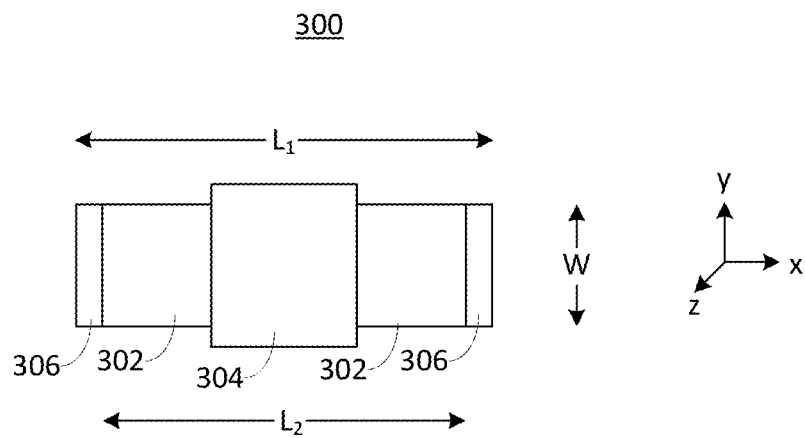
FIGS. 3A and 3B illustrate example dimensions for a sensor included in a beam accelerometer.
Figure 3B:
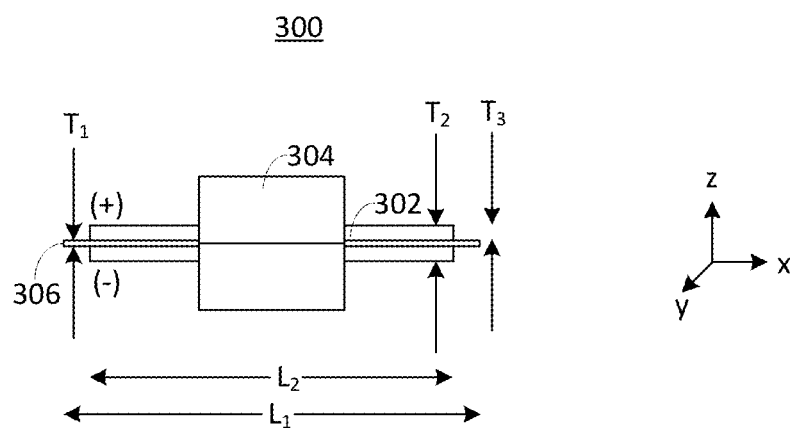

The amount of charge build up caused by the bending of the piezoelectric ceramic may depend on the dimensions of the piezoelectric ceramic. For example, FIGS. 3A and 3B illustrate a top view of example Sensor Element 300 and a side view of example Sensor Element 300, respectively. For example, Sensor Element 300 may include Ceramic Piezoelectric 302, Mass 304, and Center Vein 306. In order to determine the amount of acceleration caused by a seismic wave, a relationship between the voltage across two faces of Ceramic Piezoelectric 302 (e.g., an anode side and a cathode side) and the detected acceleration may be developed.

For example, when Mass 304 is moved along the z-axis, a force is applied to Piezoelectric Ceramic 302, which may cause a mechanical deformation to Piezoelectric Ceramic 302. The amount of deformation may depend on the mass of Mass 304, the amount of force applied to/by Mass 304, the stiffness of Piezoelectric Ceramic 302, and/or the stiffness of Center Vein 306.

The stiffness of Piezoelectric Ceramic 302 may be dependent on the dimensions of Piezoelectric Ceramic 302 and/or the overall dimensions of Sensor Element 300. For example, as illustrated in FIGS. 3A and 3B, along the y-axis Piezoelectric Ceramic 302 may have width W. Center Vein may have the same width W as Piezoelectric Ceramic 302, although in some examples it may have a different width. Along the x-axis, Piezoelectric Ceramic 302 may have length $L_2$ and Center Vein may have Length $L_1$. Length $L_1$ may represent the distance between the clamping mechanism applied on one end of Center Vein 306 and the other end of Center Vein 306. Length $L_1$ may be longer than Length $L_2$ so that the clamping mechanism may be applied to Center Vein 306.

As illustrated in FIG. 3B, Center Vein 306 may extend the entire length $L_1$, for example through Mass 304. Similarly, Piezoelectric Ceramic 302 may extend the entire Length $L_2$, for example, through Mass 304. Although Piezoelectric Ceramic 302 may be referred to as a single piece of piezoelectric material in reference to the figures, as may be appreciated Piezoelectric Ceramic 302 may be comprised of two rectangular prisms (or some other shape) of piezoelectric ceramics that are separated by Center Vein 306. Mass 304 may be built around Center Vein 306 and/or Piezoelectric Ceramic 302 as will be discussed in further detail below. Further, Center Vein 306 may have Thickness $T_1$. Similarly, Piezoelectric Ceramic 302 may have effective Thickness $T_2$ (e.g., the distance between the two faces of Piezoelectric Ceramic 302).

The materials and dimensions used to construct Center Vein 306 may be selected such that the overall stiffness of Center Vein 306 is lower than the stiffness of Piezoelectric Ceramic 302. For example, to ensure that the dimensions and/or material used to construct Piezoelectric Ceramic dictate the overall stiffness of the beam, the stiffness of Center Vein 306 may be designed such that it is one or more orders of magnitude less stiff than Piezoelectric Ceramic 302. In an example, the stiffness of Center Vein 306 may be designed to be two orders of magnitude lower than the stiffness of Piezoelectric Ceramic 302. In another example, the stiffness of Center Vein 306 may be designed to be four orders of magnitude lower than the stiffness of Piezoelectric Ceramic 302. The stiffness of the materials may be related to the elasticity (e.g., defined by and/or related to the Young's modulus of the material) for a given material, as well as one or more of the dimensions W, $L_1$, $L_2$, $T_1$, and/or $T_2$. For example, Center Vein 306 may be comprised of a material such as brass (and/or some other material with a elasticity similar to brass), and the dimensions of Center Vein 306 may be selected such that the overall stiffness of the combination of Piezoelectric Ceramic 302 and Center Vein 306 may be essentially the stiffness of Piezoelectric Ceramic 302.

Although Piezoelectric Ceramic 302 is shown to be a rectangular prism in FIGS. 3A and 3B, the piezoelectric ceramic within the sensor may take other shapes and/or dimensions. As may be appreciated, changing the shape of the piezoelectric material may affect its stiffness and/or piezoelectric response (e.g., the relationship between the amount of force exerted on the ceramic and the resulting voltage output). Although examples for determining the stiffness of the piezoelectric material and/or the voltage response of the piezoelectric material may be described in terms of a rectangular prism of piezoelectric material, other shapes may be utilized in order to achieve a desirable stiffness to density of mass ratio.

In an example, when the stiffness of Piezoelectric Ceramic 302 is much greater than the stiffness of Center Vein 306, the relationship between the stiffness of Piezoelectric Ceramic 302 and/or the amount by which Piezoelectric Ceramic 302 bends when Mass 304 is displaced may depend on one or more of dimensions W, $L_1$, $L_2$, $T_1$, and/or $T_2$ (e.g., when Piezoelectric Ceramic is rectangular in shape). For example, the voltage across the sides of Piezoelectric Ceramic 302 may be expressed as:

$$v_o = \frac{3}{8} \cdot g_{31} \cdot \frac{F \cdot L_2}{W \cdot T_2} \cdot \left(1 - \frac{T_1^2}{T_2^2}\right) \cdot C \qquad \text{Equation (1)}$$

where $g_{31}$ may be a Piezoelectric voltage constant, F may be the applied force by the mass, $L_2$ may be the length of the piezoelectric ceramic, W may be the width of the piezoelectric ceramic, $T_2$ may be the thickness of the piezoelectric ceramic (e.g., the distance between the faces of the piezoelectric ceramic), $T_1$ may be the thickness of center vein/beam, and C may be an empirical weighting factor. In an example, C may be omitted from Equation (1).

Since the dimensions of the piezoelectric ceramic are known, by measuring the voltage across the piezoelectric ceramic, the amount of force imparted between the mass and the piezoelectric ceramic may be determined. Additionally, since the mass is also known, the amount of acceleration may also be determined. Similar relationships between the piezoelectric dimensions and the voltage per unit of force may be developed for piezoelectric materials of other shapes (e.g., elliptical base, circular basis, etc.).

When measuring acceleration caused by seismic pressure waves, sinusoidal acceleration of a mass may be proportional to the displacement of the mass and the square of the frequency of the wave. For example, the general sinusoidal acceleration may be expressed as $$A = \omega^2 D_1/G \qquad \text{Equation (2)}$$

where A may be the acceleration, ω may be the angular frequency of the wave, $D_1$ may be the displacement, and G may be may be a constant. Thus, as the frequency decreases, the displacement may be increased exponentially in order to maintain the same level of acceleration. Similarly, if the displacement is held constant, the amplitude of the acceleration decreases with the square of the frequency. As may be appreciated from Equation (2), as the frequency decreases, the amount of displacement for a given amount of acceleration may decrease.

The ratio of the density of the mass to the stiffness of the piezoelectric ceramic may define the relative sensitivity to acceleration for the sensor. For example, a higher ratio of mass density to ceramic stiffness may result in a sensor that is more sensitive to low amplitude acceleration and/or low frequency acceleration. As a lower the frequency wave may result in smaller amplitudes of acceleration, in order to measure acceleration at the frequency range of interest (e.g., 1-3 Hz or lower), the density to stiffness ratio may be maintained above a minimum level to ensure adequate signal strength at the desired frequency range.

For example, since the force applied to a given area may define the pressure, and the pressure acting on a material of a given stiffness may be proportional to the displacement experienced by the material, the sensitivity of the device to low frequency operation may be directly proportional to the ratio of the density of the mass to the stiffness of the material, for example if the volume of the mass is to be kept below a certain threshold (e.g., to ensure that the acceleration sensor can be produced at a commercially viable size).

As an example, for a mass of Tungsten alloy, the density may be about 17 g/cm³ or $1.7 \times 10^4$ kg/m³. For a piezoelectric ceramic, the stiffness of the material may be based on the Young's modulus of the ceramic (e.g., elasticity) and the dimensions of the ceramic. In an example, the piezoelectric ceramic material used for the acceleration sensor may have a Young's modulus on the order of $6 \times 10^{10}$ N/m². For example, PZT-5A may have a Young's modulus of approximately $6.6 \times 10^{10}$ N/m². The deformation ($D_2$) of the beam may be expressed as:

$$D_2 = F/k \qquad \text{Equation (3)}$$

where F may be the force by applied the mass, and k may be the composite stiffness of Piezoelectric Ceramic 302 and Center Vein 306. As an example, the stiffness k of Piezoelectric Ceramic 302 and Center Vein 306 may be determined based on the Young's modulus for the beam materials and the dimensions of the beam materials.

For example, the composite stiffness of the beam may be the sum of the stiffness of Piezoelectric Ceramic 302 (e.g., which may be divided into two halves separated by Center Vein 306) and the stiffness of Center Vein 306. If the center vein is a rectangular prism, the stiffness of Center Vein 306 may be expressed as:

$$k_{cv} = \frac{192 \cdot \varepsilon_{cv} \cdot I_{cv}}{L_2^3} \qquad \text{Equation (4)}$$

where $\varepsilon_{cv}$ may be the elasticity modulus of the vein material (e.g., represented by Young's modulus), $I_{cv}$ may be the moment of inertia for the vein, and $L_2$ may be the length of the shared surface area between Center Vein 306 and Piezoelectric Ceramic 302 (e.g., the length of Piezoelectric Ceramic 302 since it is longer than Center Vein 306). The moment of inertia for the center vein may be further expressed as:

$$I_{cv} = \frac{W \cdot T_1^3}{12} \quad \text{Equation (5)}$$

where W may be the width of the vein (e.g., from FIG. 3A) and $T_1$ may be the thickness of the vein (e.g., from FIG. 3B). Thus, the overall stiffness of Center Vein 306 may depend on the elasticity (e.g., Young's modulus) of the material utilized for the vein, the length of the surface shared between the vein and the piezoelectric ceramic, the width of the vein, and the thickness of the vein. As may be appreciated, increasing one or more of Young's modulus, the width of the vein, and/or the thickness of the vein may cause the vein to increase in stiffness for center beam loads. Increasing the length of surface shared between the center vein and the ceramic may result in a decrease in the stiffness of the vein for center-borne loads.

The stiffness of Piezoelectric Ceramic 302 may be determined in a similar manner. For example, the ceramic may be comprised of two plates (e.g., rectangular prisms) of piezoelectric material that are separated by the center vein. Like the stiffness of the center vein, the stiffness for each half of Piezoelectric Ceramic 302 may be expressed as:

$$k_{pc} = \frac{192 \cdot \varepsilon_{pc} \cdot I_{pc}}{L_2^3} \quad \text{Equation (6)}$$

where $\varepsilon_{pc}$ may be the elasticity modulus of the piezoelectric material (e.g., represented by Young's modulus), $I_{pc}$ may be the moment of inertia for each half of the ceramic, and $L_2$ may be the length of Piezoelectric Ceramic 302. However, the moment of inertia for the piezoelectric ceramic may be expressed slightly differently than that of the center vein in order to account for the presence of the center vein between the two halves of the ceramic (e.g., with thickness $T_2$). For example, if thickness $T_3$ represents the thickness of half of Piezoelectric Ceramic 302 (e.g., $T_2 = T_1 + 2T_3$), then the moment of inertia for a half of the piezoelectric ceramic may be expressed as:

$$I_{pc} = \frac{W \cdot T_1^3}{12} + \left(\left(\frac{T_1 + T_3}{2}\right)^2 \cdot L_2 \cdot W\right) \quad \text{Equation (7)}$$

Thus, the moments of inertia for each of the center vein and the halves of the piezoelectric ceramic may be determined based on the dimensions selected for the sensor (e.g., assuming the mass loads the center of the beam). Additionally, the stiffness of the center vein may be determined based on the moment of inertia of the center vein and the length of the shared surface area between the center vein and the piezoelectric ceramic. Similarly, the stiffness of each of the piezoelectric ceramic may be determined based on the moment of inertia of the piezoelectric ceramic and the length of the piezoelectric ceramic. Therefore, the composite stiffness of the entire beam may be determined by summing the stiffness of the vein and the stiffness of the two halves of the ceramic.

For example, beam with the following dimensions may be utilized: a center vein length ($L_1$) of approximately 1.43 inches; a piezoelectric ceramic length ($L_2$) of approximately 1.25 inches, a center vein and/or piezoelectric ceramic width (W) of approximately 0.42 inches; a center vein thickness ($T_1$) of approximately 0.016 inches; and a total beam thickness ($T_2$) of approximately 0.122 inches (e.g., each ceramic half may have a thickness ($T_3$) of 0.053 inches). The ceramic may be comprised of PZT-5A, which may have a Young's modulus of approximately $6.6 \times 10^{10}$ N/m². The center vein may be comprised of brass, which may have a Young's modulus of approximately $11.7 \times 10^{10}$ N/m². Using these values for the dimensions and properties of the materials, the stiffness of the center vein may be determined to be approximately $4.19 \times 10^4$ N/m and the stiffness of each half of the ceramic may be approximately $1.04 \times 10^8$ N/m. Since the total stiffness of the beam may be the sum of the stiffness of the center vein and the stiffness of the two halves of the ceramic, the total of stiffness of the beam for these dimensions and materials may be $2.08 \times 10^8$ N/m.

As may be seen from this example, the overall stiffness of the piezoelectric ceramic may be orders of magnitude larger than the stiffness of the center vein. Thus, the overall stiffness of the beam may be heavily dependent on the stiffness of the ceramic. Since the stiffness of the center vein may have little to no practical impact on the stiffness of the beam, it may be assumed that the entire acceleration of the mass results in bending of the ceramic, with little to no energy lost to bend the relatively flexible (e.g., as compared to the ceramic) center vein.

As force applied to the center of the beam due to acceleration of the mass relative to the beam may be proportional to the density of the mass, the density to stiffness ratio for a mass and beam may provide an accurate measure of the sensitivity of the sensor to low level acceleration. For example, if the dimensions and materials described above are utilized for the beam and the mass is comprised of a Tungsten alloy with a density of approximately $1.7 \times 10^4$ kg/m³, then the ratio of mass density to beam stiffness may be approximately $8.2 \times 10^{-5}$ kg/Nm². In order to limit the volume of the mass and the dimensions of the ceramic and center vein to a reasonable size that may be commercially viable (e.g., on the order of 8 in³ or less for an omnidirectional beam accelerometer that includes three orthogonally-oriented sensors) while still allowing the sensor to be sensitive enough to detect low levels of low-frequency acceleration, a minimum density to stiffness ratio of approximately $4.5 \times 10^{-5}$ kg/Nm² may be utilized. Although a smaller ratio may be utilized, smaller ratios may result in overly large accelerometers due to an increased size of the mass. Using a typical piezoelectric ceramic such as PZT-5A, such a density to stiffness ratio may result in an overall sensitivity of the sensor of approximately 1.75 V/g (e.g., +/−10%). Despite the relatively low energy levels that are present due to the smaller acceleration experienced at frequencies at or near 1 Hz, such a sensitivity may still allow for a response of approximately 1.75 V/g at the frequencies of interest.

In order to measure the acceleration in a single dimension, the sensor elements may be configured with a high degree of cross-axis isolation. For example, an ideal point sensor may respond to acceleration in any direction and the response of the sensor to a force may be approximately the same in all directions (e.g., no cross-axis isolation). An ideal line sensor may be configured to respond to acceleration across either of two axes (e.g., with cross-axis isolation in the third dimension). An ideal plane sensor may have a primary response in one axis, and cross-axis isolation in the other two dimensions.

In practical scenarios, even a plane sensor may have some response to force components that are orthogonal to the dimension the plane sensor is configured to measure. To account for the non-ideal nature of real world devices, in an example a plane sensor may be designed to with a width-to-length ratio that is selected in order to permit greater displacement in the primary response axis as compared to the other axes. For example, the specific dimensions of the beam (e.g., Piezoelectric Ceramic 302 and/or Center Vein 306) and/or Mass 304 may be selected to attempt to minimize the torsional response as a result of cross-axis excitation while maximizing the permitted displacement over the axis of measurement. Such a method also allows for a knife clamp along the short edge of Center Vein 306.

The knife clamp may be designed to be symmetrically applied to each side of the beam (e.g., Center Vein 306). Utilizing a symmetric clamp may help prevent stress across the beam that is caused by an excitation across an axis that is not the axis of interest for the beam (e.g., not the desired measurement direction). For example, the knife clamp may be applied across the width of the beam on a line that is perpendicular to the length of the beam. Symmetric clamps may be applied to each end of the beam, and the clamps may be applied such that the center of mass of the mass is located at the center of the length between the two clamps (e.g., the mass may be equidistant from each clamp such that the mass is centered between the clamps).

Generally, a smaller length to width ratio may result in better cross-axis isolation, however, if the ratio of length to width falls below a given threshold, the size of mass that would be used in order to achieve a sufficient voltage response due to the bending of the piezoelectric may increase to impractical levels. Similarly, although a large length to width ratio may allow for effective accelerometer operation with a smaller or less dense mass, the beam may be more susceptible to torsion and may achieve a lower (e.g., unacceptable) level of cross-axis isolation. In an example, if the mass is to be constructed from Tungsten or a Tungsten alloy (and/or a material of similar density), then a piezoelectric ceramic with length to width dimensions in the range of 4:1 to 2:1 may be utilized. In an example, a length to width ratio of approximately 3.2:1 was found to be an acceptable point to tradeoff between mass size and level of cross axis-isolation. For example, using materials such as PZT-5A, brass, and a Tungsten alloy for the piezoelectric ceramic, center vein, and center mass, respectively, a length to width ratio of approximately 3.2:1 may achieve a cross axis isolation of approximately 46 dB.

The sensitivity of the acceleration sensor may also be dependent of the ratio of the piezoelectric voltage constant magnitude to Young's modulus of the piezoelectric material. For example, a large piezoelectric voltage constant may correspond to a material that demonstrates a larger voltage differential as a result of applied pressures. Thus, piezoelectrics with large piezoelectric voltage constants may have a larger magnitude voltage response when the material is bent or stressed as compared to materials with lower piezoelectric voltage constants. For example, PZT-5A may have a piezoelectric voltage constant magnitude of approximately $11.5 \times 10^{-3}$ Vm/N and a Young's modulus of approximately $6.6 \times 10^{10}$ N/m². Thus the ratio of the piezoelectric voltage constant magnitude to Young's modulus may be approximately $1.7 \times 10^{-13}$ Vm³/N². Although a ratio of the piezoelectric voltage constant magnitude to Young's modulus as low as approximately $1.1 \times 10^{-13}$ Vm³/N² may be utilized, choosing a ceramic with a ratio much below $1.1 \times 10^{-13}$ Vm³/N² may result in the deformation of the beam being too large for practical operation on a large scale.

Figure 4A:
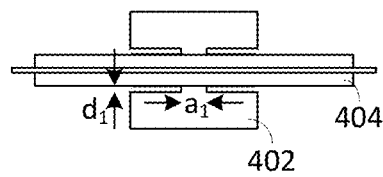
FIGS. 4A-4D illustrate example techniques for attaching a mass to the center of a beam included in an acceleration sensor.

The accelerometer mass may be operably coupled to the piezoelectric ceramic and/or to the center vein in a number of ways. The center of mass of the mass may be designed to be located at the center of the beam. For example, FIGS. 4A, 4B, 4C, and 4D illustrate example arrangements for attaching the mass to the piezoelectric ceramic and/or center vein. The mass may be designed to contact the piezoelectric ceramic over a relatively small area. For example, the mass may be designed to be attached to the piezoelectric material across a small area in the center of the beam. For example, FIG. 4A illustrates a cross-section of an example technique for adhering the mass to the ceramic. As shown in FIG. 4A, Mass 204 may be operably connected to Beam 404 over a distance $a_1$. The distance $a_1$ may be designed to be as close to a line as practically achievable. By adhering the mass to the piezoelectric ceramic at a line along the center of the beam, the overall stiffness of the beam may be less affected by the adhesion of the mass (e.g., which is typically stiffer than the piezoelectric ceramic) than if the mass was attached to the ceramic over a larger area. For example, if the mass was adhered to the piezoelectric ceramic over the full length of the mass, the stiffness of the mass may prevent the portion of the beam from flexing at locations along the length that are adjacent to the mass. Such an increase in stiffness may affect the voltage response of the piezoelectric for a given amount of force applied by the mass, leading to distortions in measurements.

To prevent the mass from affecting the flexibility of the piezoelectric ceramic, distance $a_1$ may be selected to be a relatively small distance centered on the middle of the beam. Moreover, areas of the mass that are not in direct contact with the mass (e.g., sections of Mass 402 that are more than $0.5a_1$ units from the center of Beam 204) may be shaped to include an air gap between Mass 402 and Beam 404. For example, the air gap may be at least distance $d_1$. The distance $d_1$ may selected based on the estimated maximum amount of displacement to be experience by Mass 402. For example, the distance $d_1$ may be selected to ensure that the sections of Mass 402 that are not in contact with Beam 404 (e.g., the areas of Mass 402 that include the air gap) do not come into contact with Beam 404 during periods of maximum operational displacement of Mass 402. In this manner, the amount of bending experienced by Beam 404 may be less affected by the stiffness of the material comprising Mass 402 due to less surface area in contact with Beam 404.

Figure 4B:
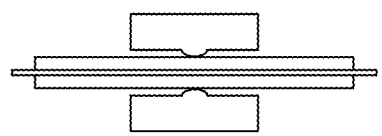
Figure 4C:
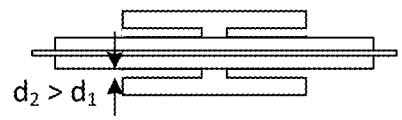

FIG. 4B illustrates a cross-section of an example of another technique for adhering the mass to the piezoelectric ceramic. As shown in FIG. 4B, the mass adhesion junction (e.g., the area over which the mass is attached to the center beam/piezoelectric ceramic) may be lessened in area by rounding the edge of the mass used to attach the mass to the piezoelectric ceramic. By doing so, the region of contact between the mass and the piezoelectric may become closer to a line, resulting in more ideal bending/bowing of the piezoelectric ceramic. FIG. 4C illustrates a cross-section of an example of another techniques for adhering the mass to the piezoelectric ceramic. As may be appreciated, the dimensions of the mass may vary based on a particular design. For example, although the mass is shown to be approximately a cube in FIG. 4A, a mass of similar total mass is shown in FIG. 4C, although the dimensions may be different.

Figure 4D:
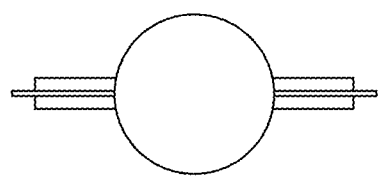

For example, FIG. 4C is meant to illustrate a mass that extends less in height than a cubic mass, but also extends further in the longitudinal direction alongside the center beam. Such a mass may still have a center of mass in the center of the beam, but may also utilize a relatively longer air gap since the mass may extend further up the beam in either direction. To prevent the mass from contacting the beam during periods of maximum displacement, the air gap may be increased in height to distance $d_2$. The distance associated with the air gap may be increased due to the increase in the amount of maximum displacement experienced by the end of the mass relative to the beam at that location. FIG. 4D illustrates an example of a spherical mass shape that may be utilized in an accelerometer sensor design. Although not shown in FIG. 4D, an air gap may also be utilized for a circular mass design to ensure that the ends of the mass do not contact the beam during periods of vibration/displacement.

Figure 5A:
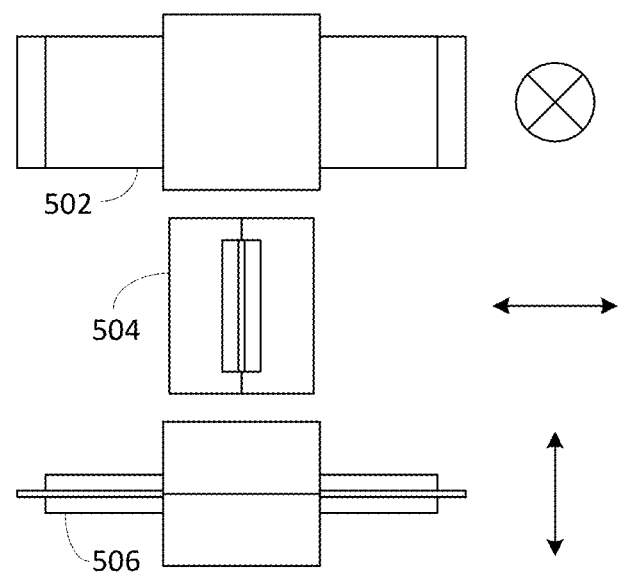
FIGS. 5A and 5B illustrate example arrangements for orienting the acceleration sensors in an orthogonal manner.
Figure 5B:
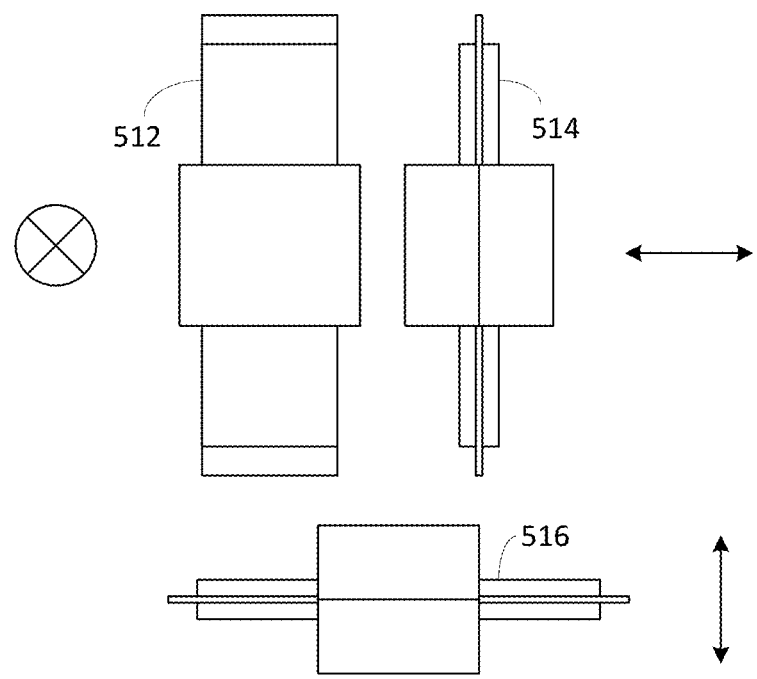

In order to measure acceleration from seismic waves in three dimensions, multiple unidirectional planar acceleration sensors may be utilized together. For example, three acceleration sensors may be arranged in an orthogonal manner in order to measure each directional component of acceleration due to a seismic wave. As an example, FIGS. 5A and 5B illustrate example arrangements for utilizing three acceleration sensors to measure each of the directions of space. As illustrated in FIG. 5A, three planar sensors may be arranged in a "stacked" manner, for example by placing a sensor 502, sensor 504, and sensor 506 along a line. Each of sensor 502, sensor 504, and sensor 506 may be aligned such that they measure acceleration along a respective orthogonal axis. For example, sensor 502 may measure acceleration into and/or out of the page, sensor 504 may measure acceleration along the horizontal axis of the page, and sensor 506 may measure acceleration along the vertical axis of the page. The center of each mass may be attached to the center of each beam. As was illustrated in FIGS. 4A-4D, the mass may be attached to a relatively small portion of the beam at the center of the beam. As shown by the arrangement illustrated in FIG. 5A, the centers (e.g., center of gravity) of each mass may be arranged such that they are on a line within a three dimensional sensor (e.g., in a "stacked" arrangement).

Other sensor arrangements may be utilized. For example, FIG. 5B illustrates an example where sensor 512 and sensor 514 may be arranged side-by-side above sensor 516. In this example, sensor 512 may measure acceleration into and/or out of the page, sensor 514 may measure acceleration along the horizontal axis of the page, and sensor 516 may measure acceleration along the vertical axis of the page. As may be various other arrangements may be utilized provided that each sensor is aligned in such a way so as to measure acceleration along a different axis. In order to limit the overall size of the sensor, the sizes of the individual sensors (e.g., dimensions of the beam and/or mass) and the arrangement of the sensors within the accelerometer (e.g., the three orthogonal sensors) may be configured such that the total volume of the accelerometer may be 8 in$^3$ or less.

Figure 6:
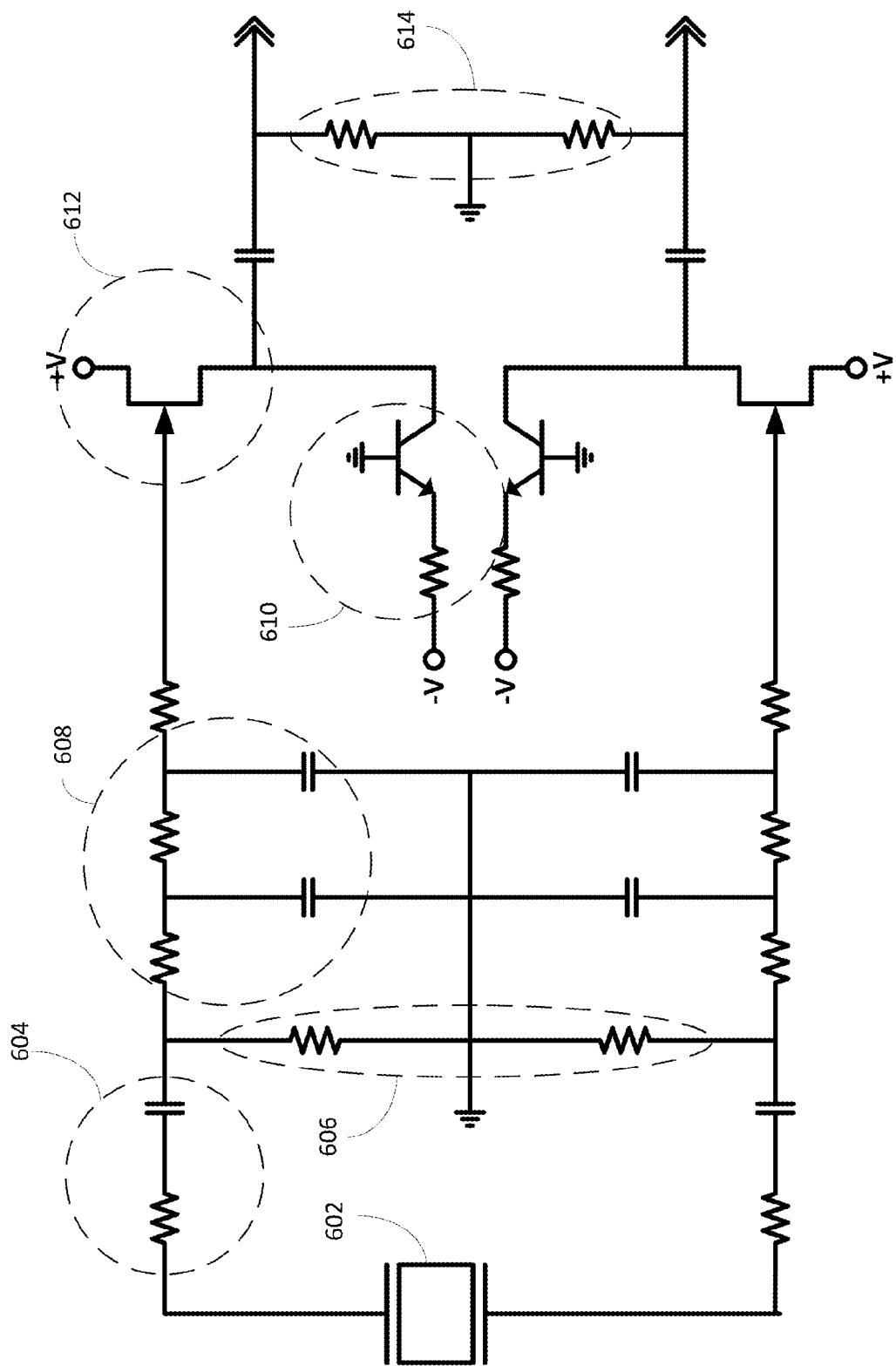
FIG. 6 illustrates an example interface circuit for a beam accelerometer.

Although piezoelectric materials generate a voltage when they are bent or compressed, the voltage output from the piezoelectric may be susceptible to loading if directly coupled to a measuring device or analog-to-digital (A/D) converter. Therefore, the anode side and cathode side of the piezoelectric ceramic may be operably connected to an interface circuit that may form an interface between the piezoelectric and the voltage measuring device. For example, FIG. 6 illustrates an example interface circuit that may be utilized to connect the piezoelectric ceramic to another device such as an A/D converter. Although interface circuit may process the voltage output from each face/side of the piezoelectric ceramic in a similar manner, for purposes of brevity FIG. 6 may be describe with respect the processing of a single face voltage.

For example, acceleration sensor 602 may be operably coupled to alternating current (AC) coupling components 604. AC coupling components 604 may include a coupling capacitor designed to block direct current (DC) signals present in the piezoelectric output from affecting circuit operation. Adequate coupling capacitors may be selected in order to ensure low frequency signals are passed to the interface circuit while preventing DC signals from affecting the circuit. Additionally, a relatively high input impudence may be achieved using components 606. For example, large resistors (e.g., 500 MΩ-3 GΩ) may be coupled to components 604 in order to increase the input impedance. Since the output of the piezoelectric ceramic is a voltage, the large input impedance may prevent loading due to the differences in the piezoelectric ceramic impedance and the interface circuit impedance. Moreover, components 606 may define the shunt resistance for the accelerometer. Therefore, in order to achieve a larger magnitude voltage response from the piezoelectric during periods of mass displacement, the input impedance of the interface circuit may be selected to be an extremely large resistive value (e.g., on the order of GΩ).

Resonance filters 608 may be utilized in order to filter the response at one or more accelerometer resonance frequencies. For example, by lowering the operational frequency range in order to measure low frequency seismic waves (e.g., 1-3 Hz or lower), the resonance frequency may also be lowered near the bandwidth associated with signals of interest (e.g., one example resonance frequency may be at or near 900 Hz). Resonance filters 608 may be designed to filter the response at the resonance frequencies in order to remove signals not of interest. For example, resonance filters 608 be configured/designed to filter the response at the resonant frequency (e.g., 900 Hz in an example) such that the response of the accelerometer at resonance does not affect the operation of the measuring device (e.g., an A/D converter). Resonance filters 608 may also be placed at the output of output impedance components 614 to achieve a similar effect.

Junction gate field-effect transistors (jFETs) may be utilized in order to interface with an A/D converter. For example, jFET 612 may be an ultra-low noise (e.g., on the order of 5nV/rt-Hz) jFET designed to covert the voltage signal to a current signal for input to an A/D converter. Current source components 610 may be configured to set the operating point of jFET 612 to ensure low distortion by ensuring that jFET 612 remains in the linear range of operation over the range of input voltages from the accelerometer.

Output impedance components 614 may be designed to provide a low output impedance for interfacing with the A/D converter. For example, in order to minimize the attenuation of the signal when measured by the A/D converter, output impedance components 614 may be selected to be relatively small values. For example, output impedance components 614 may have an impedance of approximately 20 kΩ.

In order to position the beam relative to the housing of the accelerometer, clamps may be applied to the ends of the beam. In an example, to avoid affecting the voltage response of the piezoelectric ceramic, the clamp may be applied to the center vein. FIGS. 7A, 7B, 7C, and 7D illustrate example clamping techniques to be applied to the center vein.

Figure 7A:
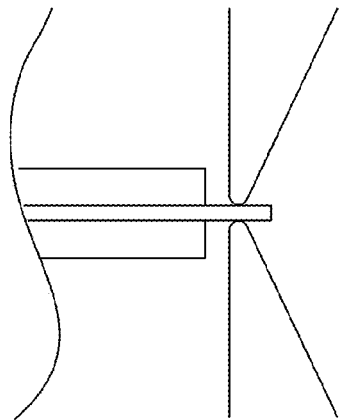
FIGS. 7A-7D illustrate example techniques for applying a knife clamp to the beam of an acceleration sensor.
Figure 7B:
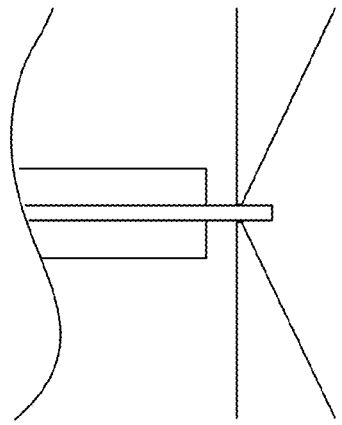

For example, FIG. 7A illustrates an example of a rounded knife edge clamp that may be applied to the center vein. The knife edge clamp may be configured such that the contact between the clamp and the vein is as close to a line as is practically achievable. Such a design may allow for the mass to bend the piezoelectric ceramic even due to low frequency vibration/seismic excitation. FIG. 7B illustrates an example knife clamp that is less rounded at the contact point. Such a design may minimize manufacturing costs due to the ease of maintaining tolerances.

Figure 7C:
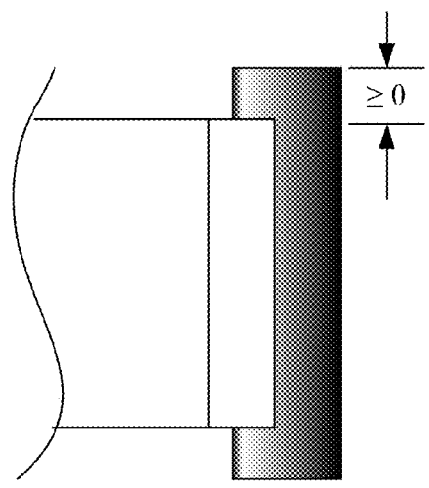
Figure 7D:
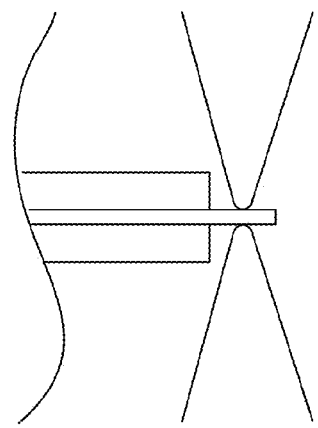

FIG. 7C illustrates a bottom view illustrating an example of the underside of the clamping mechanism. As is illustrated in FIG. 7C, the clamping mechanism may extend wider than the vein and/or the ceramic in order to ensure the clamp is applied the entire width of the vein. In this manner, the clamp may ensure that a minimum amount of torsion is applied to ceramic during operation. FIG. 7D illustrates another example clamping mechanism, for example a clamp that is symmetric in nature.

Figure 8:
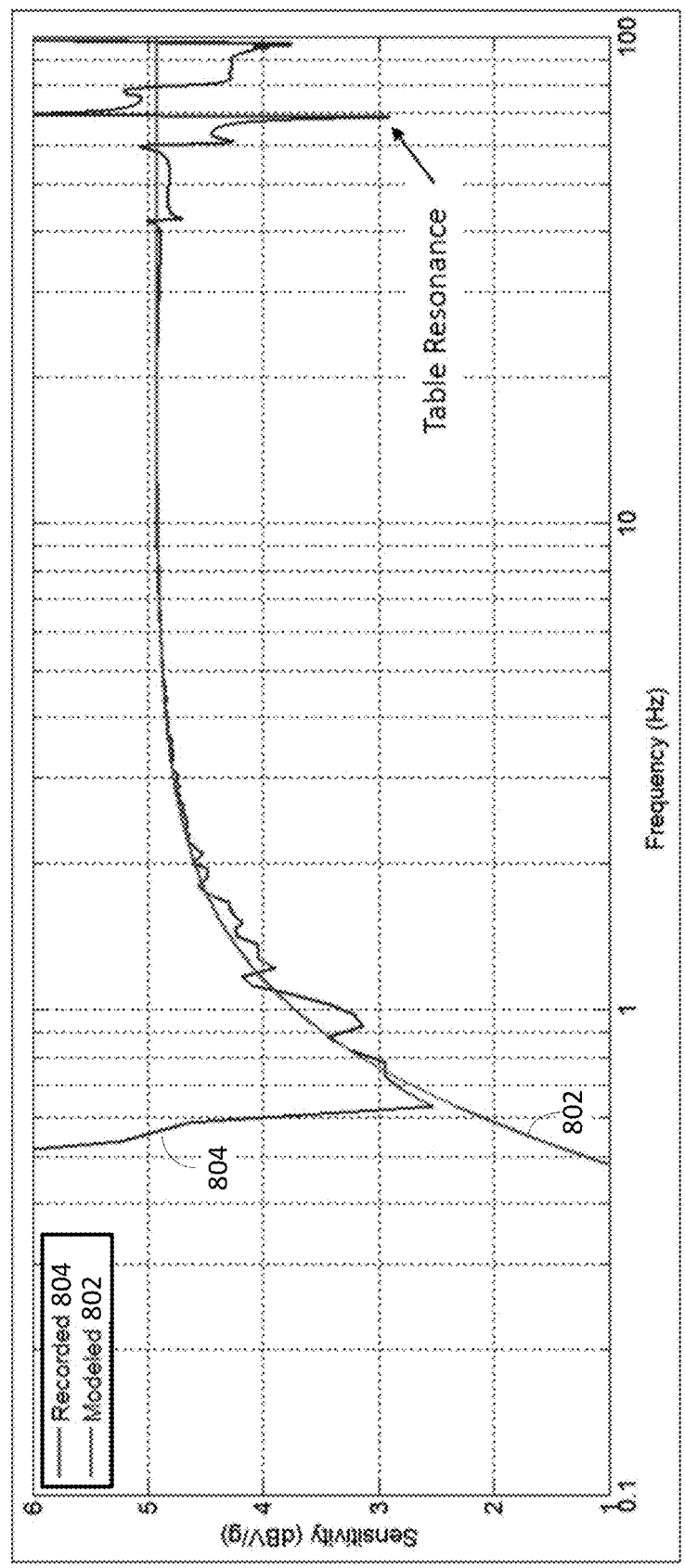
FIG. 8 illustrates predicted and measured sensitivity responses for an example beam accelerometer.

FIG. 8 illustrates a plot of the relative sensitivity of an example beam accelerometer. As illustrated in FIG. 8, sensitivity data 802 may represent the predicted sensitivity of the accelerometer over the frequency ranges of interest utilizing one or more of the techniques and/or materials described herein. Sensitivity data 804 may represent examples measurements of actual recorded sensitivities of a prototype accelerometer. For example, the prototype accelerometer may use a Tungsten alloy mass with a PZT-5A piezoelectric ceramic (e.g., with dimensions similar to those described with reference to FIG. 3B, above). Such an accelerometer may have a density to stiffness ratio of approximately $8.2 \times 10^{-5}$ kg/Nm², thus facilitating low frequency operation.

As is illustrated by FIG. 8, a prototype accelerometer may be constructed to achieve a passband sensitivity of approximately 5 dBV/g (e.g., +/−0.5 dB) and may have a corner frequency in the range of 0.54 Hz. Low frequency performance in accordance with the predicted results were achieved at frequencies as low as 0.6 Hz. For example, in the frequency range of 1-3 Hz, the beam accelerometer may have a sensitivity of at least 3 dBV/g. With other material and/or accelerometer dimensions, such results may be achievable at even lower frequency levels.

Figure 9:
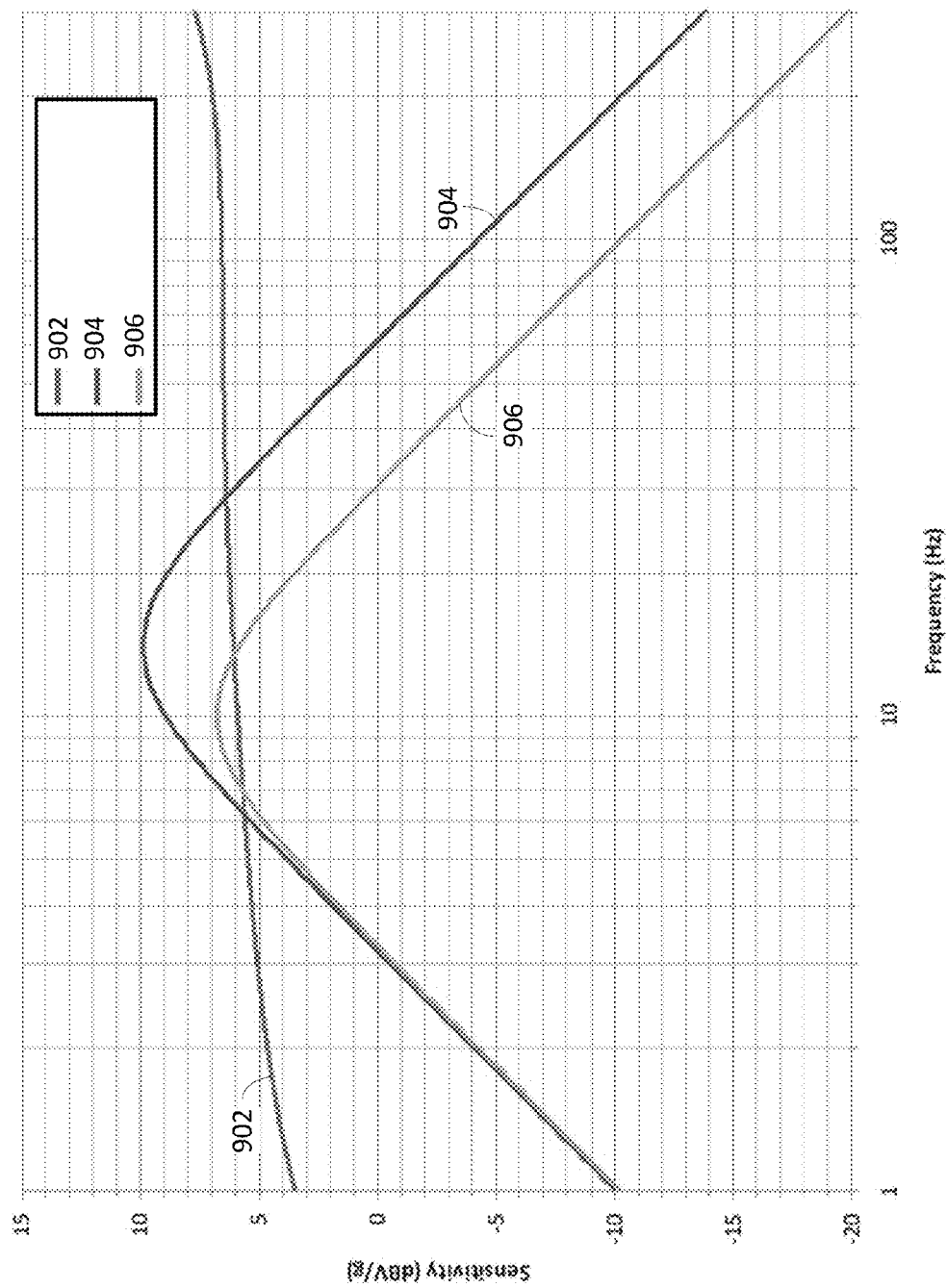
FIG. 9 illustrates an example comparison of the sensitivity of an example beam accelerometer to example geophones.

Such levels of sensitivity to low frequency acceleration may achieve more accurate acceleration measurements at low frequencies than previously used devices. For example, FIG. 9 illustrates a comparison of the sensitivity of the prototype accelerometer of FIG. 8 with two commonly used geophones. For example, sensitivity response 902 may be the same response as was illustrated in FIG. 8 (e.g., response data 804). Sensitivity response 904 may represent the sensitivity response of a geophone such as the ION SM-60B laboratory geophone while sensitivity response 906 may represent the sensitivity response of a geophone such as the OYO GS-20DX 10 Hz geophone. As may be appreciated from FIG. 9, the accelerometer may achieve more uniform operation at the low frequency ranges (e.g., from 1-10 Hz), allowing for more meaningful measurements in the low frequency range.

Figure 10:
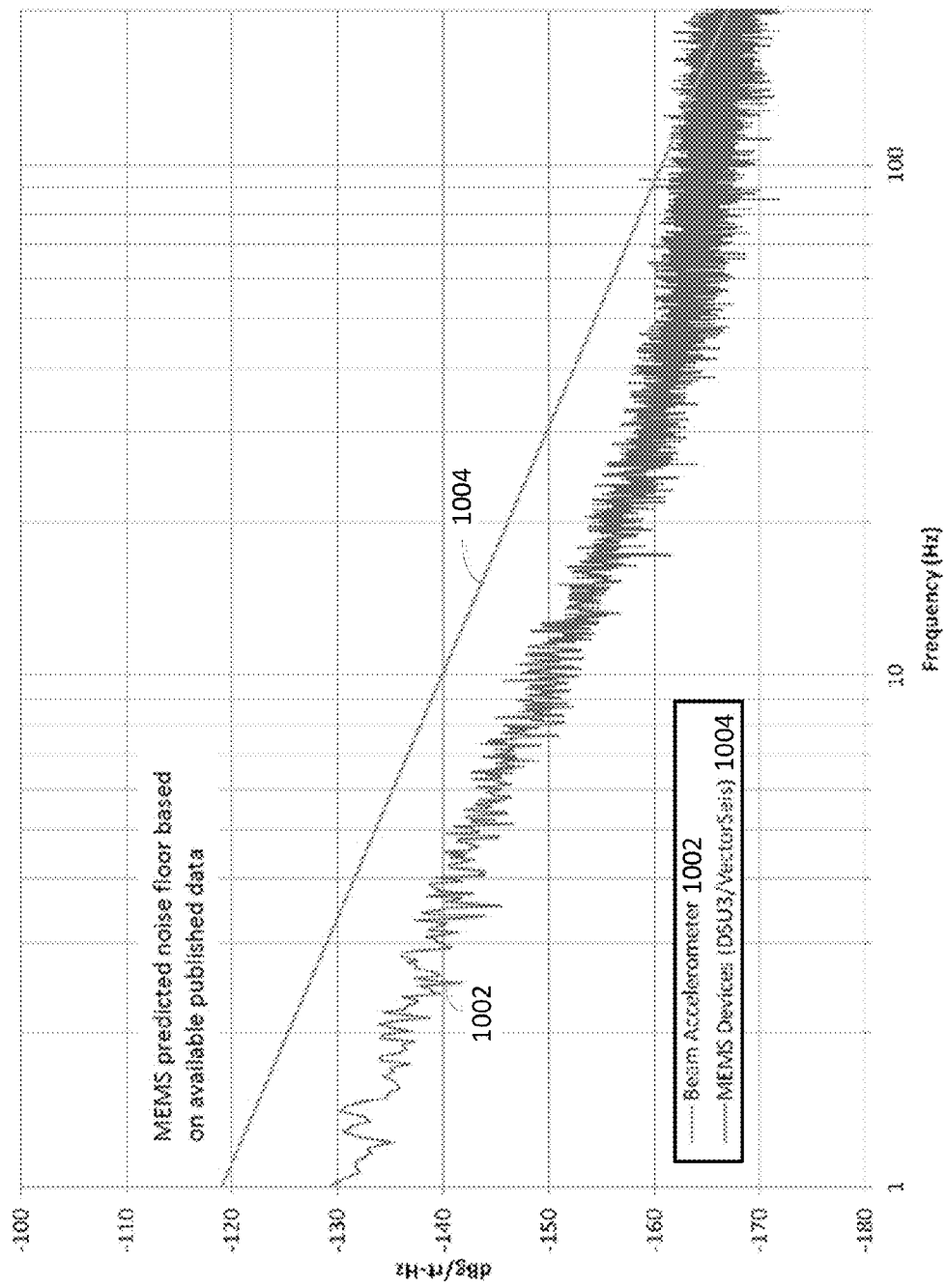
FIG. 10 illustrates a comparison of the minimum detectable signal comparison (e.g., noise floor) between an example beam accelerometer as described herein and typical MEMS devices.

FIG. 10 illustrates a comparison of the minimum detectable signal comparison (e.g., noise floor) between a beam accelerometer as described herein (e.g., Beam Accelerometer 1002) and typical MEMS devices (e.g., MEMS devices 1004). Such a comparison may be based on the amount of noise introduced by the devices as a function of frequency. For example, for Beam Accelerometer 1002, the amount of noise introduced by the measuring instruments) may be based on the corner frequency, which may depend on the capacitance of the piezoelectric ceramic and/or the shunt resistance of the Beam Accelerometer 1002. The actual achievable noise floor may also depend on the dimensions/sensitivity of Beam Accelerometer 1002. As is illustrated by FIG. 10, prototype Beam Accelerometer 1002 was able to achieve a lower effective noise floor over the desired low frequency range as compared to what is predicted for MEMS devices 1004. Such a difference may be attributable to design aspects of Beam Accelerometer 1002, such as a relatively high piezoelectric capacitance (e.g., on the order of nanofarads) and/or the relatively high sensitivity levels of the piezoelectric (e.g., on the order of 5 dBV/g).

Thus, the beam accelerometers described herein may achieve more meaningful measurements (e.g., less noisy) at the relatively low frequency range (e.g., 1-3 Hz or lower) than previous geophone and/or MEMS systems. For example, the beam accelerometer may achieve a relatively lower noise floor and may be configured to detect and remove mechanical noise. On the other hand, gimbaled geophones may be susceptible to mechanical noise caused by the motion of the gimbal in keeping the geophone response parallel to gravity, while MEMS accelerometers may have a relatively higher noise floor, for example due to their relatively small capacitance element (e.g., on the order of picofarads). The gimbaled geophone may also suffer from a relatively non-flat frequency response of the dynamic range of the device, adversely affecting the signal to noise ratio (SNR). Although MEMS devices may achieve a flat response down to about 3 Hz, their relatively high noise floor can affect the range of the device at the low end of the dynamic range (e.g., around 1-3 Hz or lower).

Further, although MEMS accelerometers may achieve a relatively high sensitivity over their range of operation (e.g., a range that may be effectively higher than the beam accelerometer due to a relatively high noise floor), MEMS devices may require high power equipment to be co-located with the sensor in order to measure sensor output. Since MEMS devices are often designed to measure changes in capacitance, the sensor signal cannot be transmit any significant distance without being adversely affected by the capacitance present in the environment and transmission media. Thus, complex circuitry that is often relatively high power is often co-located with the MEMS sensing element.

In contrast, although the beam accelerometer assembly may include a three-axis seismic sensor designed for low frequency applications down to 1 Hz or lower, the passive nature of the ceramic construction utilizes approximately the same amount of power as conventional velocity sensors. For example, each the passive nature of the sensor may result in approximately 25 mW operation per sensor direction (e.g., the interface circuit may utilize approximately 25 mW during operation). Such low-power operation may be achieved even with a response that is proportional to acceleration, thus providing reliable output even at low frequencies. The ultra-quiet sensing element of the beam accelerometer may have a noise density well below MEMS alternatives while providing a greater bandwidth extending into the low frequency. As a result, the relatively simple elemental construction of the sensor in the beam accelerometer and its passive, low power design may facilitate reliability, as there may be less active circuitry co-located with the sensor that could breakdown during device operation.

What is claimed:

1. An omnidirectional beam accelerometer configured to measure low frequency waves, the omnidirectional beam accelerometer comprising:
   three beam acceleration sensors, wherein each beam acceleration sensor comprises a respective beam comprising a piezoelectric material and a respective mass operably coupled to the center of the respective beam, and each beam acceleration sensor has a ratio of a density of the respective mass [kg/m3] to the stiffness of the respective beam [N/m] of at least 4.5 ×10−5kg/Nm2;
   a housing, wherein each of the three beam acceleration sensors are operably coupled to the housing using knife clamps applied to each respective end of each of the beam acceleration sensors, and each of the three beam acceleration sensors is configured to measure acceleration in a respective orthogonal direction with a cross axis isolation of approximately 40 dB or better; and
   an interface circuit operably coupled to each of the three beam acceleration sensors, the interface circuit configured to interface the three beam acceleration sensors with an analog to digital (A/D) converter.

2. The omnidirectional beam accelerometer of claim 1, wherein the respective beams of each of the beam acceleration sensors further comprise a center vein that separates the piezoelectric material into two plates, and each of the knife clamps are applied to the center vein of the respective beams.

3. The omnidirectional beam accelerometer of claim 1, wherein the interface circuit has an input impedance of at least 500 MΩ.

4. The omnidirectional beam accelerometer of claim 1, wherein each of the respective masses are comprised of Tungsten or a tungsten alloy.

5. The omnidirectional beam accelerometer of claim 1, further comprising a power unit, wherein the power unit operates at 75 mW or less.

6. The omnidirectional beam accelerometer of claim 1, wherein the interface circuit has an output impendence of 20 kΩ or less.

7. The omnidirectional beam accelerometer of claim 1, wherein each center of mass for each respective mass are located along a common line within the omnidirectional beam accelerometer.

8. The omnidirectional beam accelerometer of claim 1, wherein a corner frequency for omnidirectional beam accelerometer is less than 1 Hz.

9. The omnidirectional beam accelerometer of claim 8, wherein a capacitance of the piezoelectric material is at least 1 nanofarad and a shunt resistance of the omnidirectional beam accelerometer is at least 500 MΩ.

10. An omnidirectional beam accelerometer comprising:
three beam acceleration sensors, wherein each beam acceleration sensor comprises a respective beam comprising a piezoelectric material and a respective mass operably coupled to the center of the respective beam, each beam acceleration sensor has a ratio of a density of the respective mass [kg/m$^3$] to the stiffness of the respective beam [N/m] of at least $4.5 \times 10^{-5}$ kg/Nm$^2$, and a ratio of a piezoelectric voltage constant [Vm/N] of the piezoelectric material to the elasticity [N/m$^2$] of the piezoelectric material is at least $1.1 \times 10^{-13}$ Vm$^3$/N$^2$;
a housing, wherein each of the three beam acceleration sensors are operably coupled to the housing using knife clamps applied to each respective end of each of the beam acceleration sensors, and each of the three beam acceleration sensors is configured to measure acceleration in a respective orthogonal direction with a cross axis isolation of approximately 40 dB or better; and
an interface circuit operably coupled to each of the three beam acceleration sensors, the interface circuit configured to interface the three beam acceleration sensors with an analog to digital (A/D) converter.

11. The omnidirectional beam accelerometer of claim 10, wherein the respective beams of each of the beam acceleration sensors further comprise a center vein that separates the piezoelectric material into two plates, and each of the knife clamps are applied to the center vein of the respective beams.

12. The omnidirectional beam accelerometer of claim 10, wherein the interface circuit has an input impedance of at least 500 MΩ.

13. The omnidirectional beam accelerometer of claim 10, wherein each of the respective masses are comprised of Tungsten or a tungsten alloy.

14. The omnidirectional beam accelerometer of claim 10, further comprising a power unit, wherein the power unit operates at 75 mW or less.

15. The omnidirectional beam accelerometer of claim 10, wherein the interface circuit has an output impendence of 20 kΩ or less.

16. The omnidirectional beam accelerometer of claim 10, wherein each center of mass for each respective mass are located along a common line within the omnidirectional beam accelerometer.

17. The omnidirectional beam accelerometer of claim 10, wherein a corner frequency for omnidirectional beam accelerometer is less than 1 Hz.

18. The omnidirectional beam accelerometer of claim 17, wherein a capacitance of the piezoelectric material is at least 1 nanofarad and a shunt resistance of the omnidirectional beam accelerometer is at least 500 MΩ.

* * * * *